United States Patent
Prabhakar (10) Patent No.: US 7,969,785 B1
(45) Date of Patent: Jun. 28, 2011

(54) LOW VOLTAGE NON-VOLATILE MEMORY WITH CHARGE TRAPPING LAYER

(76) Inventor: Venkatraman Prabhakar, Pleasanton, CA (US)

( * ) Notice: Subject to any disclaimer, the term of this patent is extended or adjusted under 35 U.S.C. 154(b) by 475 days.

(21) Appl. No.: 12/009,723

(22) Filed: Jan. 22, 2008

Related U.S. Application Data (60) Provisional application No. 60/994,496, filed on Sep. 20, 2007.

(51) Int. Cl.
*G11C 11/34* (2006.01)

(52) U.S. Cl. .......... 365/185.19; 365/185.28; 365/185.29

(58) Field of Classification Search ............ 365/185.19, 365/185.29, 185.28
See application file for complete search history.

(56) References Cited

U.S. PATENT DOCUMENTS

| | | | |
|---|---|---|---|
| 5,768,192 A | 6/1998 | Eitan | |
| 6,011,725 A | 1/2000 | Eitan | |
| 6,331,953 B1* | 12/2001 | Wang et al. | 365/185.29 |
| 6,512,696 B1* | 1/2003 | Fan et al. | 365/185.18 |
| 6,674,138 B1* | 1/2004 | Halliyal et al. | 257/411 |
| 6,930,928 B2* | 8/2005 | Liu et al. | 365/185.29 |
| 7,035,147 B2* | 4/2006 | Yeh et al. | 365/185.29 |
| 7,060,564 B1* | 6/2006 | Kang et al. | 438/266 |
| 7,242,622 B2* | 7/2007 | Hsu et al. | 365/185.29 |
| 7,489,573 B2* | 2/2009 | Sugawara | 365/201 |
| 7,894,257 B1* | 2/2011 | Prabhakar | 365/185.01 |
| 2006/0022252 A1* | 2/2006 | Doh et al. | 257/314 |
| 2006/0125027 A1* | 6/2006 | Chien et al. | 257/410 |

OTHER PUBLICATIONS

Chan, et al., "A True Single-Transistor Oxide-Nitride-Oxide EEPROM Device," IEEE Electron Device Letters, vol. EDL-8, No. 3, Mar. 1987.

Eitan, et al., "NROM: A Novel Localized Trapping, 2-Bit Nonvolatile Memory Cell," IEEE Electron Device Letters, vol. 21, No. 11, Nov. 2000.

Lusky, et al., "Characterization of Channel Hot Electron Injection by the Subthreshold Slope of NROM Device," IEEE Electron Device Letters, vol. 22, No. 11, Nov. 2001.

\* cited by examiner

*Primary Examiner* — Alexander Sofocleous
(74) *Attorney, Agent, or Firm* — Michael C. Stephens, Jr.

(57) ABSTRACT

Methods, circuits, processes, devices, and/or arrangements for a non-volatile memory (NVM) cell operable at relatively low voltages are disclosed. In one embodiment, an NVM cell can include: (i) a gate over a charge trapping layer, the charge trapping layer being insulated from the gate by a first insulating layer, the charge trapping layer being insulated from a channel by a second insulating layer; and (ii) source and drain on either side of the channel, the channel being under the second insulating layer, where the NVM cell is configured to be erased by channel-induced hot holes (CHH).

29 Claims, 6 Drawing Sheets

LOW VOLTAGE NON-VOLATILE MEMORY WITH CHARGE TRAPPING LAYER

RELATED APPLICATIONS

This application claims the benefit of U.S. Provisional Application No. 60/994,496, filed on Sep. 20, 2007, incorporated herein by reference in its entirety.

FIELD OF THE INVENTION

The present invention generally relates to the field of semiconductor memories. More specifically, embodiments of the present invention pertain to methods, circuits, processes, devices, and/or arrangements for providing a low voltage non-volatile memory (NVM) cell.

DISCUSSION OF THE BACKGROUND

Non-volatile memory devices (e.g., electrically erasable programmable read-only memory (EEPROM) and flash, etc.) are in widespread use in the industry today. Non-volatile memory (NVM) devices are used in compact flash cards for digital cameras, memory sticks, jump drives, EEPROM chips for booting-up devices (e.g., basic input/output system (BIOS)), and in many other applications.

In an NVM cell with an oxide-nitride-oxide (ONO) structure, a polysilicon gate may be on a 3-layer dielectric ONO structure formed with a nitride charge trapping layer over a tunneling oxide layer, and below a blocking oxide layer. To program the cell in one conventional approach, charge is injected into the nitride layer using Fowler-Nordheim (F-N) tunneling through the tunneling oxide layer, and this is done at relatively high voltages (e.g., in the 14 V to 18 V range). In order to keep the operating voltages in a reasonable range, the tunneling oxide layer has to be quite thin (e.g., about 20 Å). However, such a thin tunneling oxide layer can cause data retention problems whereby charge may leak from the nitride over the operating lifetime of the NVM cell.

In another conventional approach, NVM cell programming is done using channel hot electron (CHE) injection, and erasing with band-to-band tunneling hot holes (BTBT-HH). The problem with this approach is the relatively high voltages required to induce band-to-band tunneling to perform the erase. In addition, the holes in BTBT-HH tend to create a lot of damage in the tunneling oxide layer, thus impacting the cell reliability. Further, the hot electron and hot hole distributions are both very close to the junction, yet not spatially matched. Thus, the peaks of the hot electron and hot hole injections occur in different places in the charge trapping layer, resulting in long term reliability issues.

SUMMARY OF THE INVENTION

Embodiments of the present invention relate to methods, circuits, processes, devices, and/or arrangements for providing a non-volatile memory (NVM) cell that is operable at relatively low voltages.

In one embodiment, an NVM cell can include: (i) a gate over a charge trapping layer, the charge trapping layer being insulated from the gate by a first insulating layer, the charge trapping layer being insulated from a channel by a second insulating layer; and (ii) source and drain on either side of the channel, the channel being under the second insulating layer, wherein the charge trapping layer of the NVM cell is configured to be erased by channel-induced hot holes (CHH).

In one embodiment, an NVM cell circuit can include: (i) a gate over a charge trapping layer, the charge trapping layer being insulated from the gate by a first insulating layer, the charge trapping layer being insulated from a channel by a second insulating layer; (ii) source and drain on either side of the channel, the channel being under the second insulating layer; (iii) a program control circuit configured to apply a first voltage on the gate, a second voltage on the source, and a third voltage on the drain; and (iv) an erase control circuit configured to apply a fourth voltage on the gate, a fifth voltage on the source, and a sixth voltage on the drain, the fourth, fifth, and sixth voltages being sufficient for CHH through the second insulating layer.

In another embodiment, a method of erasing an NVM cell having a charge trapping layer can include the steps of: (i) applying a first fixed voltage on a drain of the NVM cell; (ii) applying a second fixed voltage on a source of the NVM cell; and (iii) ramping down a voltage on a gate of the NVM cell from a first voltage level to a second voltage level, where the voltage on the gate is sufficient to produce CHH injected through an insulating layer and into the charge trapping layer.

In another embodiment, an electrically erasable programmable read-only memory (EEPROM) device can include: (i) a controller configured to control programming, erasing, and reading of a memory portion; and (ii) the memory portion including an NVM cell having: (a) a gate over a charge trapping layer, the charge trapping layer being insulated from the gate by a first insulating layer, the charge trapping layer being insulated from a channel by a second insulating layer; and (b) source and drain on either side of the channel, the channel being under the second insulating layer, wherein the charge trapping layer of the NVM cell is configured to be erased by CHH injection.

Embodiments of the present invention can advantageously provide an NVM cell operable at relatively low voltages by using a CHH erase mechanism, thus reducing power consumption over conventional approaches. These and other advantages of the present invention will become readily apparent from the detailed description of preferred embodiments below.

DETAILED DESCRIPTION OF THE PREFERRED EMBODIMENTS

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, schematic symbols, and other symbolic representations of operations on code, data bits, data streams, signals, or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "processing," "operating," "computing," "calculating," "determining," "manipulating," "transforming" or the like, refer to the action and processes of a computer or data processing system, or similar processing device (e.g., an electrical, optical, or quantum computing or processing device or circuit), that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," "signal," "conductor," and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

A novel non-volatile memory (NVM) cell with a charge trapping layer, and that is operable at relatively low voltages, is disclosed. For example, charge for storage during programming can be injected into the charge trapping layer (e.g., nitride, oxynitride, etc.) using channel hot electron (CHE) and/or Fowler-Nordheim (F-N) tunneling. Erasing (e.g., removing charge from the nitride) may be performed using channel-induced hot holes (CHH). By using these approaches in particular embodiments, the programming and erasing functions can be performed at relatively low voltages. Consequently, high voltage transistors may not be needed, and overall process and operating complexity can be reduced.

The invention further relates to hardware implementations of the present arrangement, method and circuit. Embodiments of the present invention can advantageously provide an NVM cell operable at relatively low voltages by using a CHH erase mechanism, thus reducing power consumption over conventional approaches. In addition, the CHH erase mechanism of particular embodiments can allow the tunnel oxide to be relatively thick as compared to conventional F-N erasing, thus improving NVM cell reliability (e.g., program/erase cycling and data retention). The invention, in its various aspects, will be explained in greater detail below with regard to exemplary embodiments.

Exemplary NVM Cell

In one example, an NVM cell includes: (i) a gate over a charge trapping layer, the charge trapping layer being insulated from the gate by a first insulating layer, the charge trapping layer being insulated from a channel by a second insulating layer; and (ii) source and drain on either side of the channel, the channel being under the second insulating layer, where the NVM cell is configured to be erased by channel-induced hot holes (CHH).

Figure 1:
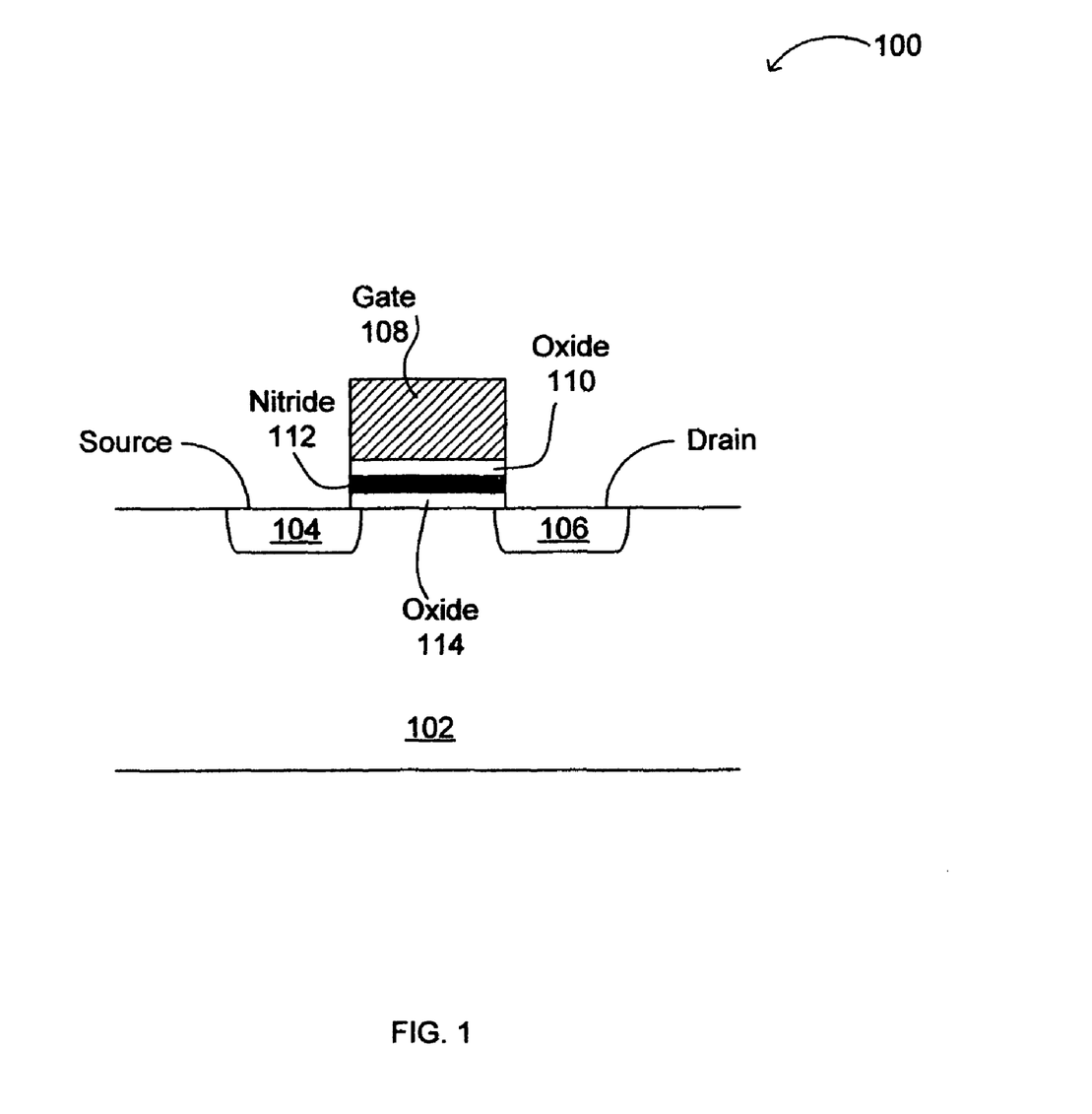
FIG. 1 is a cross-section diagram of a non-volatile memory (NVM) cell with oxide-nitride-oxide (ONO) structure.

FIG. 1 shows an NVM cell with an oxide-nitride-oxide (ONO) structure. In this cell, polysilicon gate 108 is on a 3-layer dielectric ONO structure formed with nitride charge trapping layer 112 over oxide layer 114, and below oxide layer 110. Oxide layer 114 is the tunneling oxide through which charge is injected into charge trapping layer 112. Oxide layer 110 is the blocking oxide that prevents injected charge from leaking out of charge trapping layer 112. Source and drain N+ regions are 104 and 106, respectively, and PWELL or P-substrate 102 of the N-type NVM cell forms the bulk connection.

In one example of an NVM cell, charge trapping layer 112 can be silicon nitride (SiN), with blocking and tunnel oxide layers 110 and 114 being silicon dioxide ($SiO_2$). To program the cell, charge may be injected into nitride layer 112 using Fowler-Nordheim (F-N) tunneling through oxide layer 114, and this is done at relatively high voltages (e.g., in the 10 V to 18 V range). While high voltage transistors may be used for F-N tunneling applications, relatively low current may be needed for F-N programming. As a result, an entire block can be programmed in "one-shot," and in a relatively short amount of time (e.g., about 10 ms). Further, appropriate bits can be erased using CHH. This approach may be utilized in applications where the programming time is important and the application allows the added process cost for the high voltage transistors. Also, some embodiments can include an F-N mode for programming (e.g., in a factory for high throughput), and a CHE mode for programming (e.g., in the field). Thus, combinations of both F-N tunneling and CHE injection can be used in programming an NVM cell in particular embodiments. The use of CHH for erasing allows bottom/tunnel oxide 114 to be thick enough to achieve good data retention by reducing the long term charge leakage from charge trapping layer 112. This is a significant advantage over the use of F-N for erasing, in which case tunnel oxide 114 could be as low as 20 Å.

In charge trapping memory devices, in addition to the higher voltages required for F-N erasing (e.g., from about 10 V to about 18 V), there is a phenomenon known as erase saturation where, if tunnel oxide 114 is made thicker, the charge going through the top oxide 110 becomes equal to the charge going through the bottom/tunnel oxide 114, and the cell does not erase. To avoid this, F-N erase requires the use of a relatively thin bottom oxide (e.g., as low as 20 Å), and this can lead to data retention problems. However, F-N programming may exhibit only a minimal saturation effect. Therefore, by using either F-N programming or CHE programming, a relatively thick bottom oxide (e.g., in a range of from about 30 Å to about 70 Å, such as about 50 Å) can be employed when CHH erase as described herein is used. This approach can substantially improve data retention over conventional approaches.

The CHH erase method as described herein is also preferable to band-to-band tunneling hot holes (BTBT-HH) because the difference in electron and hole locations, as well as the damage to the bottom oxide, creates device reliability problems after multiple program/erase cycles. Further, particular embodiments can utilize combinations of F-N and CHE programming in order to make the charge distribution in the nitride/charge trap layer more uniform.

Figure 2:
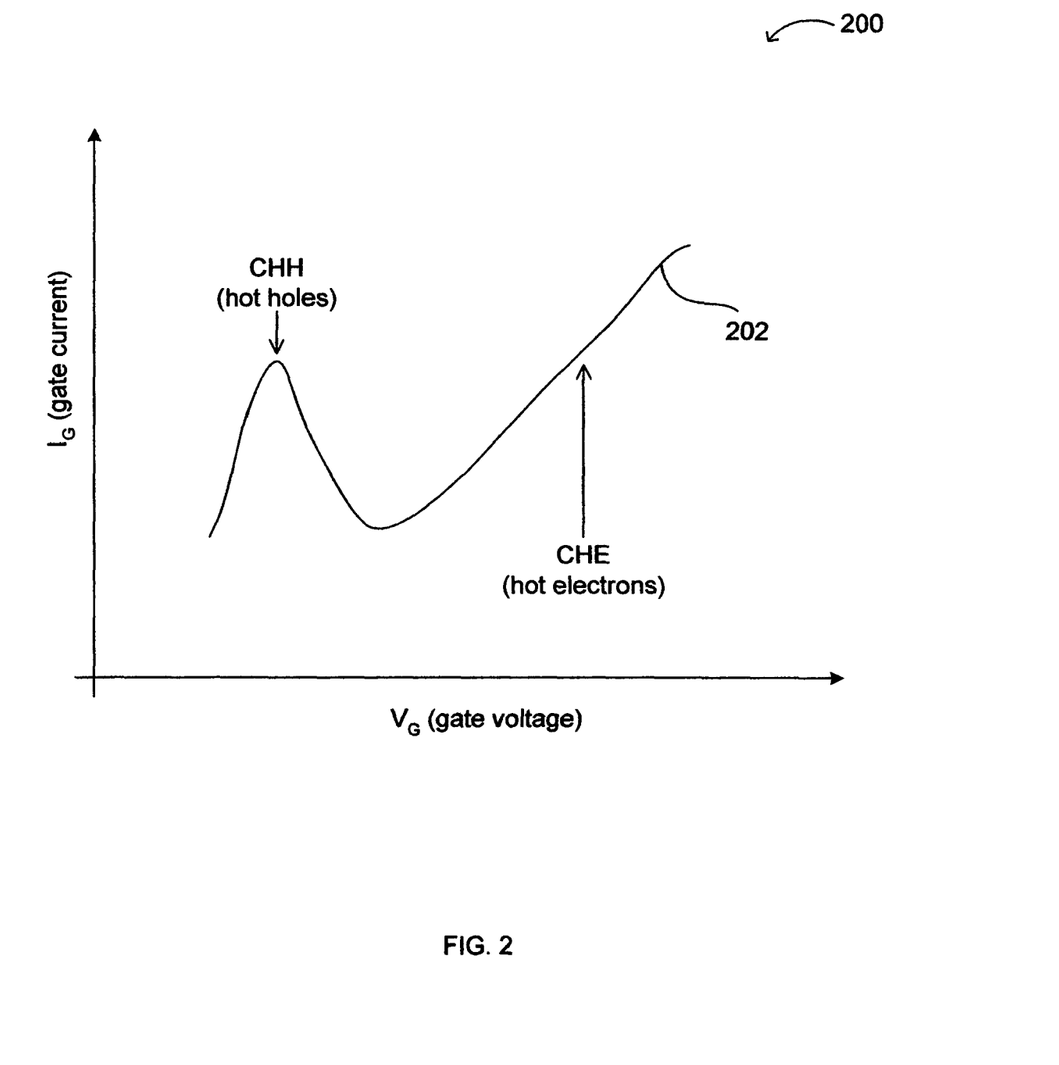
FIG. 2 is an example gate current plot suitable for use in accordance with embodiments of the present invention.

Referring now to FIG. 2, an example gate current plot 200 suitable for use in accordance with embodiments of the present invention is shown. Gate current ($I_G$) as a function of the gate voltage ($V_G$) is shown as waveform 202, with erasing occurring using CHH injection, and programming occurring using CHE injection. Example voltages for cell operation in program, erase, and read modes, are shown below in Table 1. These example voltages can be applied to place the NVM cell in a CHE injection region for programming, and CHH injection region for erasing. Further, erasing using CHH in particular embodiments can employ a voltage ramping (e.g., a ramp down) on the gate for improved performance.

TABLE 1

| Operation | Program (CHE) | Erase (CHH) | Read |
|---|---|---|---|
| $V_G$ (gate) | 5.5 V | 2 V (ramp down $V_G$ from 4 V to 1 V, or 4 V to 0 V) | 1.8 V |
| $V_D$ (drain) | 5 V | 5 V | 1.0 V |
| $V_S$ (source) | 0 V | 0 V | 0 V |

The operating voltages shown above in Table 1 may vary depending on the technology used, and also due to implant optimization on sources, drains, lightly doped drains (LDD), and halo implantations for the channel. In certain embodiments, LDD and halo implants (e.g., a tilted implant into the channel from the sides of the gate) may be optimized to achieve sufficient CHE and/or CHH generation at $V_D$ in a range of from about 4 V to about 4.5 V. In addition, a ramp of the $V_G$ during programming (e.g., CHE injection), such as from about 4 V to about 6 V, can also provide some advantages to cell reliability at the expense of more circuit complexity in achieving this ramp. However, a single programming voltage on $V_G$ (e.g., about 5.5 V) is also suitable for effective operation in certain embodiments.

In particular embodiments, the operating voltages shown above in Table 1 can be any suitable values within appropriate ranges for certain technologies and/or design approaches. For example, programming voltages can include a $V_G$ range of from about 4 V to about 8 V, a $V_D$ range of from about 4 V to about 7 V, and a $V_S$ range of from about −0.5 V to about +0.5 V. For example, erasing voltages can include a $V_G$ range of from about +5 V to about −1 V, a $V_D$ range of from about 4 V to about 7 V, and a $V_S$ range of from about −0.5 V to about +0.5 V. For example, reading voltages can include a $V_G$ range of from about 0 V to about 3.3 V, a $V_D$ range of from about 0.25 V to about 1.5 V, and a $V_S$ range of from about 0 V to about +1 V.

Exemplary NVM Cell Circuit

In one example, an NVM cell circuit includes: (i) a gate over a charge trapping layer, the charge trapping layer being insulated from the gate by a first insulating layer, the charge trapping layer being insulated from a channel by a second insulating layer; (ii) source and drain on either side of the channel, the channel being under the second insulating layer; (iii) a program control circuit configured to apply a first voltage on the gate, a second voltage on the source, and a third voltage on the drain; and (iv) an erase control circuit configured to apply a fourth voltage on the gate, a fifth voltage on the source, and a sixth voltage on the drain, the fourth, fifth, and sixth voltages being sufficient for CHH through the second insulating layer.

Figure 3:
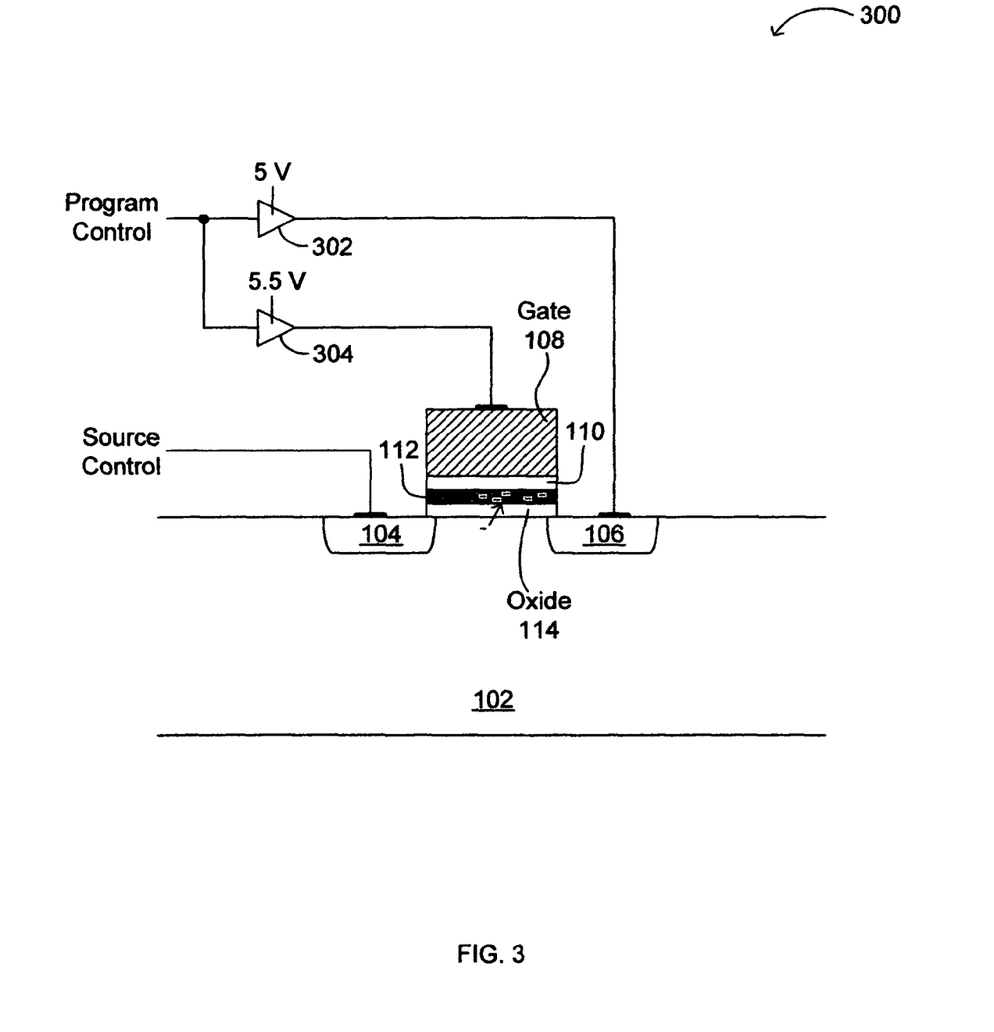
FIG. 3 is a cross-section diagram of an NVM cell in a programming configuration in accordance with embodiments of the present invention.

Referring now to FIG. 3, a cross-section diagram of an NVM cell in a programming configuration 300 in accordance with embodiments of the present invention is shown. Gate 108 may be over oxide 110, nitride 112, and oxide 114 (an oxide-nitride-oxide (ONO) structure), as shown. For example, oxide 114 is a "tunnel" oxide because electrons and holes tunnel across this oxide when charging or discharging charge trapping nitride layer 112. In this fashion, programming and erasing of the memory cell is accommodated. Region 102 may be P-type substrate or PWELL, while diffusion regions 104 and 106 may be N-type. For example, the P-type substrate may have an abundance of holes by being lightly doped with trivalent atoms, such as boron, for a silicon wafer. Also, N-type diffusion regions 104 (e.g., source) and 106 (e.g., drain), may be heavily doped with valence-five atoms, such as phosphorus or arsenic.

In the particular example of FIG. 3, a program control signal (e.g., received from a memory controller) can be received in buffer and/or level shifter circuits 302 and 304. During programming, a voltage of about 5 V may be applied to drain 106 of the NVM cell, a voltage of about 5.5 V may be applied to gate 108, and a ground level (e.g., about 0 V) may be applied to source 104 via the source control. As shown during programming, electrons can be injected into nitride 112 by way of CHE injection. These hot electrons can be trapped in the nitride, thereby increasing the threshold voltage ($V_t$) of the NVM cell, and effectively placing the NVM cell in an "OFF" state.

Other combinations of materials (e.g., doping atoms), N/P type, and underlying substrate material, such as silicon-on-insulator (SOI), can also be used in particular embodiments. Also for certain applications, programming by F-N tunneling may replace programming by CHE. In addition, tunnel oxide 114 may have a nominal thickness of about 50 Å, depending on particular process implementations or other variations. For example, a thickness of tunnel oxide 114 in certain embodiments may be in a range of from about 20 Å to about 90 Å, such as from about 30 Å to about 70 Å, and more specifically about 50 Å. Such oxide thicknesses may also be reduced as associated process technology advances.

In addition, other insulating or dielectric layers, such as high-k materials or a combination of high-k materials and $SiO_2$, can also be employed. For example, oxide 110 and/or oxide 114 may be replaced by other materials, or combinations of two or more materials, such as $Al_2O_3$ or $SiO_2/Al_2O_3$. Further, gate 108 may be implemented using polysilicon, or any other suitable conductive material, such as metal. Generally, high-k materials and metal gates may be of particular use in 45 nm and more advanced process technologies. In addition, charge trapping layer 112 may be formed by materials other than silicon nitride, such as high-k materials (e.g., HfSiON, etc.), or nanocrystals. Nanocrystals are small islands of material, such as silicon or metal (e.g., Ti).

Figure 4:
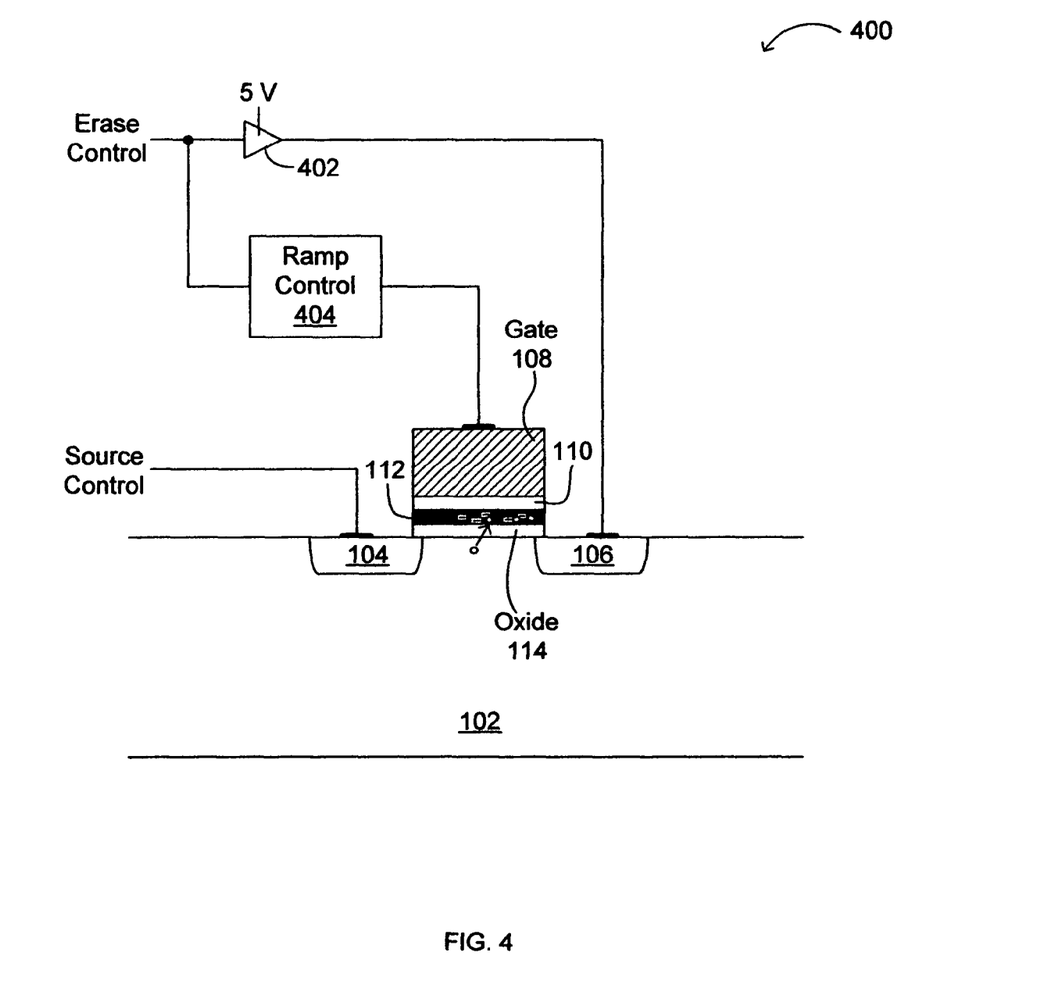
FIG. 4 is a cross-section diagram of an NVM cell in an erasing configuration in accordance with embodiments of the present invention.

Referring now to FIG. 4, a cross-section diagram of an NVM cell in an erasing configuration 400 in accordance with embodiments of the present invention is shown. Here, an erase control signal (e.g., from a memory controller) can be received in buffer and/or level shifter 402, as well as ramp control circuit 404. During erasing, a voltage of about 5 V may be applied to drain 106 of the NVM cell, a ground level (e.g., about 0 V) may be applied to source 104 via the source control, and either a fixed voltage (e.g., about 2 V), or a ramped down voltage (e.g., from about 4 V to about 1 V), may be applied to gate 108. Ramp control circuit 404 can provide voltage ramping using any suitable function, such as a staircase function.

In particular embodiments, erasing (e.g., the removal of charge from the nitride 112) can be performed using channel-induced hot holes (CHH). These hot holes can neutralize injected electrons previously trapped in nitride layer 112 during programming, thereby decreasing the $V_t$ of the NVM cell, and effectively placing the NVM cell in an "ON" state. The erase can also be continued until there is an excess of holes (i.e., positive charge) in nitride layer 112, leading to negative $V_t$. Further, hole and electron distributions may be relatively closely matched because both are determined by a channel electric field.

Programming using CHE creates an electron distribution from the middle of the channel to the drain junction. For the conventional approach using BTBT, the hot holes are generated at the drain junction, thus the hole distribution is more towards the drain side, as compared to the electron distribution. Accordingly, there are usually electrons closer to the middle of the channel which may not be removed during the erase operation. These electrons build up as program/erase (P/E) cycles progress, and create "hard to erase" cells. In contrast, the CHH holes are very closely matched to the CHE electron distribution, and the holes are also able to get to the middle of the channel to neutralize electrons trapped there. Therefore, there is no hard to erase problem after P/E cycling with the erase method of particular embodiments. In addition, as a result of using CHH injection for erasing, both the programming and the erasing can be accomplished using relatively low voltages. Thus, high voltage transistors may not be needed, and overall process and operating complexity can be reduced.

Exemplary NVM Cell Operation

Voltage may be applied to the gate, the source, and the drain of an NVM cell in order to perform programming, erasing, and/or reading of the cell. In one example, a method of erasing an NVM cell with a charge trapping layer includes the steps of: (i) applying a first fixed voltage on a drain of the NVM cell; (ii) applying a second fixed voltage on a source of the NVM cell; and (iii) ramping down a voltage on a gate of the NVM cell from a first voltage level to a second voltage level, wherein the voltage on the gate is sufficient to produce CHH injected through an insulating layer and into the charge trapping layer.

Figure 5:
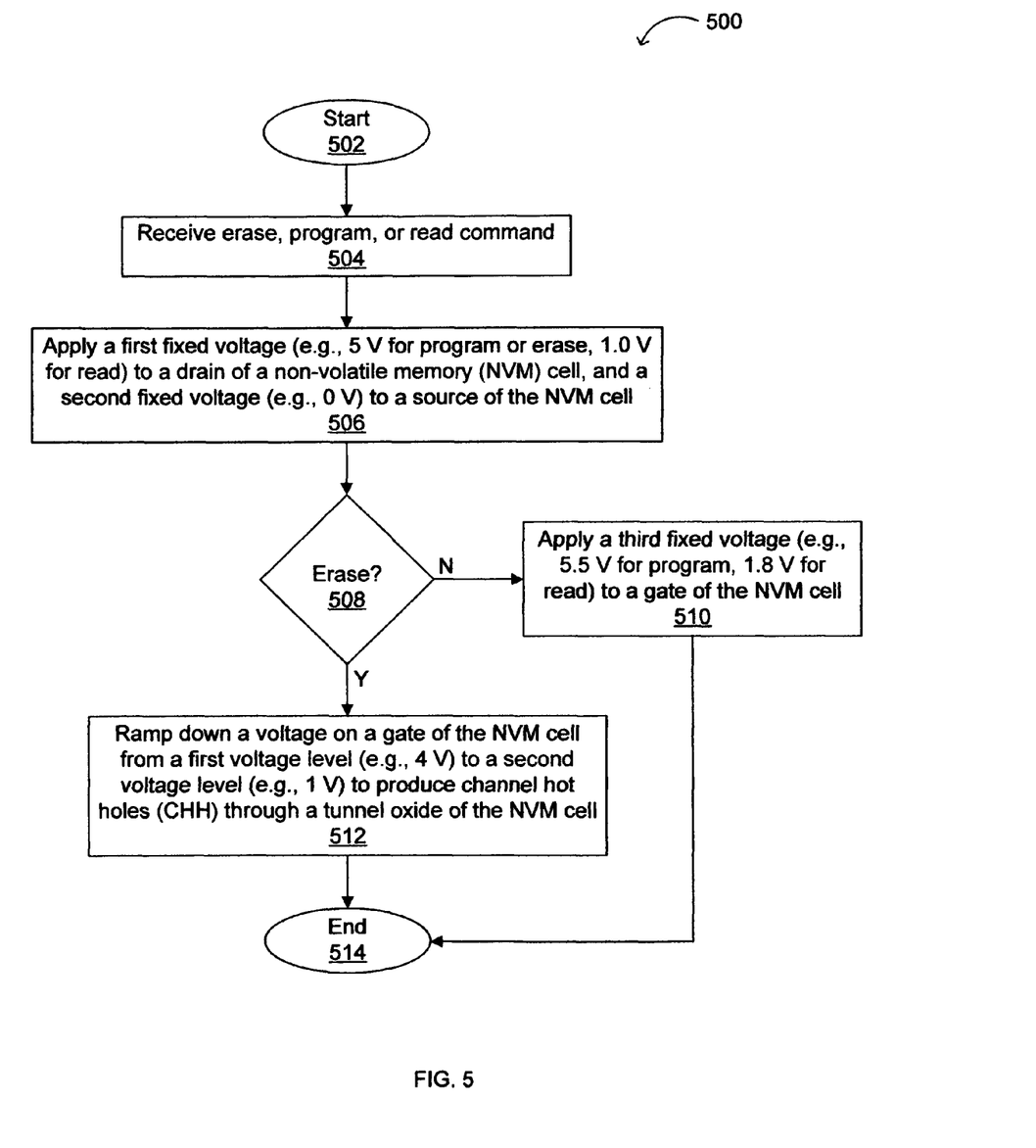
FIG. 5 is a flow diagram of an example method of operating an NVM cell in accordance with embodiments of the present invention.

Referring now to FIG. 5, a flow diagram of an example method 500 of operating an NVM cell in accordance with embodiments of the present invention is shown. The flow can begin (502), and an erase, program, or read command can be received (e.g., from a memory controller) in a memory portion of a device (504). Substantially simultaneously, a first fixed voltage (e.g., about 5 V for program or erase, about 1 V for read) can be applied to a drain of an NVM cell, and a second fixed voltage (e.g., about 0 V) may be applied to a source of the NVM cell (506).

If the command is a program or read command (508), a third fixed voltage (e.g., about 5.5 V for program, about 1.8 V for read) may substantially simultaneously be applied to a gate of the NVM cell (510), completing the flow (514). For example, these voltages are sufficient in the program mode to create CHE injection for programming the NVM cell. Alternatively, the voltages may be sufficient in the program mode to create F-N tunneling for programming the NVM cell. If the command is an erase command (508), a voltage on the gate of the NVM cell may be simultaneously or sequentially ramped down from a first voltage level (e.g., about 4 V) to a second voltage level (e.g., about 1 V) to produce CHH injection through a tunnel oxide of the NVM cell (512), thus completing the flow (514).

Exemplary NVM Cell Applications

In one example, an electrically erasable programmable read-only memory (EEPROM) device includes: (i) a controller configured to control programming, erasing, and reading of a memory portion; and (ii) the memory portion including an NVM cell having: (a) a gate over a charge trapping layer, the charge trapping layer being insulated from the gate by a first insulating layer, the charge trapping layer being insulated from a channel by a second insulating layer; and (b) source and drain on either side of the channel, the channel being under the second insulating layer, wherein the charge trapping layer of the NVM cell is configured to be erased by CHH.

Figure 6:
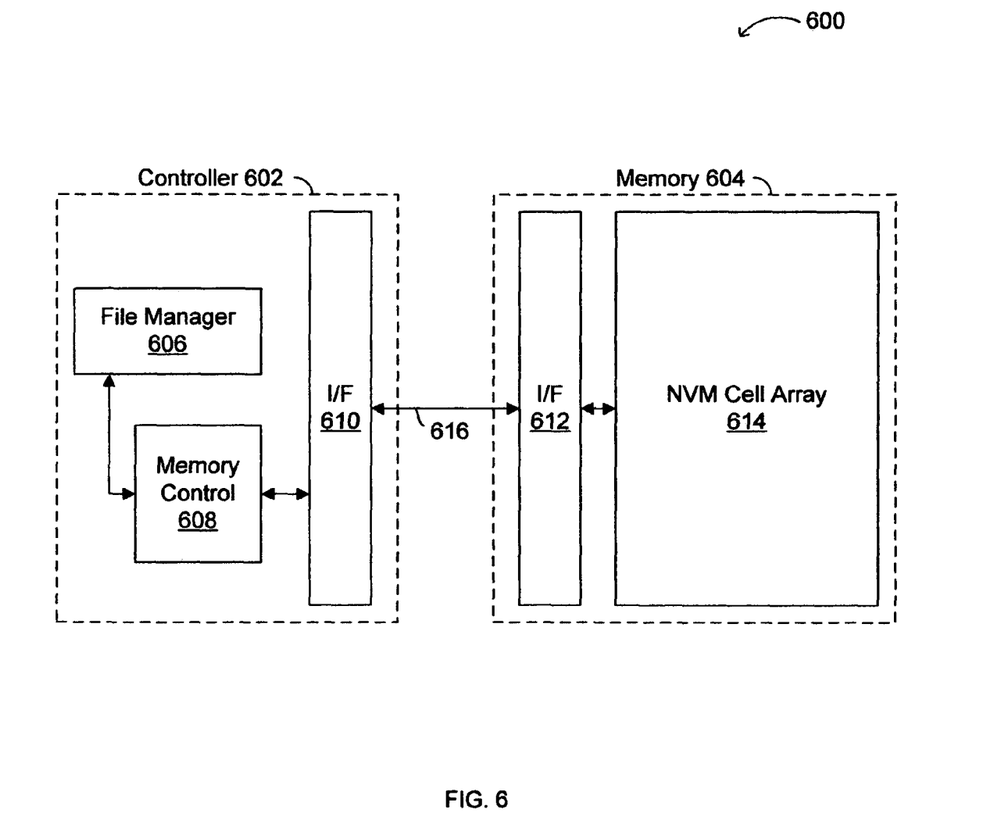
FIG. 6 is a block diagram of an example NVM cell application in accordance with embodiments of the present invention.

Referring now to FIG. 6, a block diagram of an example NVM cell application 600 in accordance with embodiments of the present invention is shown. For example, 600 is a memory stick application that incorporates non-volatile memory and a controller. Controller 602 (e.g., a host controller) can include file manager 606, memory control block 608, and interface 610. Memory 604 (e.g., an EEPROM), can include NVM cell array 614 and interface 612. For example, NAND or NOR arrangements of such NVM cells, as well as associated circuitry as described herein, can be used to form NVM cell array 614. In addition, the NVM cells described herein may be used to form NVM latches or other circuits and/or structures. Interfaces 610 and 612 can communicate over signal 616, which can include serial and/or parallel interface support, to provide clocking, address selection, data interfacing, and command control (e.g., read, program, erase). Other components can include a data buffer, registers, error correction circuitry, and voltage supply circuitry.

In this fashion, an NVM cell configured to operate at relatively low voltages by using a CHH erase mechanism can be provided. Accordingly, power consumption, as well as process and operating complexity, may be reduced relative to conventional approaches.

While the above examples include silicon implementations of NVM cells, one skilled in the art will recognize that other technologies may also be used in accordance with embodiments. Further, one skilled in the art will recognize that other circuit and/or cell arrangements or the like may also be used in accordance with embodiments. For example, the NVM cells as described herein may be also be used in latch applications, or applications involving programmable logic (e.g., programmable logic devices (PLDs), field-programmable gate arrays (FPGAs), etc.).

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A non-volatile memory (NVM) cell, comprising:
    a) a gate over a charge trapping layer, said charge trapping layer being insulated from said gate by a first insulating layer, said charge trapping layer being insulated from a channel by a second insulating layer; and
    b) source and drain on either side of said channel, said channel being under said second insulating layer, wherein said NVM cell is configured to be erased by channel-induced hot holes (CHH) that are produced by ramping down a voltage on said gate from a first positive voltage level to a second positive voltage level;
    c) wherein said NVM cell is configured to be programmed through said second insulating layer when in a high throughput mode by Fowler-Nordheim (F-N) tunneling, and when in a field programming mode by channel hot electron (CHE) injection.

2. The NVM cell of claim 1, wherein said charge trapping layer is configured to be programmed using said F-N tunneling through said second insulating layer when in said high throughput mode.

3. The NVM cell of claim 1, wherein said charge trapping layer is configured to be programmed using said CHE injection through said second insulating layer when in said field programming mode.

4. The NVM cell of claim 1, wherein said first positive voltage level is about 4V, and said second positive voltage level is about 1 V.

5. The NVM cell of claim 1, wherein said first and second insulating layers and said charge trapping layer each comprise a first material.

6. The NVM cell of claim 5, wherein said first material comprises a high-k material.

7. The NVM cell of claim 1, wherein said first and second insulating layers comprise oxide, and said charge trapping layer comprises a high-k material.

8. The NVM cell of claim 1, wherein said first insulating layer comprises oxide, and said second insulating layer comprises a high-k material.

9. The NVM cell of claim 1, wherein said first insulating layer comprises a high-k material, and said second insulating layer comprises oxide.

10. The NVM cell of claim 1, wherein said first and second insulating layers comprise oxide.

11. The NVM cell of claim 1, wherein said first and second insulating layers comprise high-k material.

12. The NVM cell of claim 1, wherein said charge trapping layer comprises nanocrystals.

13. The NVM cell of claim 1, wherein the charge trapping layer comprises nitride or oxynitride.

14. The NVM cell of claim 1, wherein said gate comprises polysilicon.

15. The NVM cell of claim 1, wherein said gate comprises metal.

16. A non-volatile memory (NVM) cell circuit, comprising:
    a) a gate over a charge trapping layer, said charge trapping layer being insulated from said gate by a first insulating layer, said charge trapping layer being insulated from a channel by a second insulating layer;
    b) source and drain on either side of said channel, said channel being under said second insulating layer;
    c) a program control circuit configured to apply a first voltage on said gate, a second voltage on said source, and a third voltage on said drain, wherein said first, second, and third voltages are sufficient to induce Fowler-Nordheim (F-N) tunneling through said second insulating layer when in a high throughput mode, and to induce channel hot electron (CHE) injection through said second insulating layer when in a field programming mode; and
    d) an erase control circuit configured to apply a fourth voltage on said gate, a fifth voltage on said source, and a sixth voltage on said drain, said fourth, fifth, and sixth voltages being sufficient for channel-induced hot holes (CHH) through said second insulating layer, said CHH being produced by ramping down said fourth voltage from a first positive voltage level to a second positive voltage level.

17. The NVM cell circuit of claim 16, wherein said charge trapping layer comprises nitride or oxynitride.

18. The NVM cell circuit of claim 16, wherein said first and second insulating layers each comprise oxide.

19. The NVM cell circuit of claim 16, wherein said first, second, and third voltages are sufficient to induce said F-N tunneling through said second insulating layer to program said charge trapping layer when in said high throughput mode.

20. The NVM cell circuit of claim 16, wherein said first, second, and third voltages are sufficient to induce said CHE injection through said second insulating layer to program said charge trapping layer when in said field programming mode.

21. The NVM cell circuit of claim 20, wherein said first voltage is about 5.5 V.

22. The NVM cell circuit of claim 20, wherein said second and said fifth voltages are each about 0 V.

23. The NVM cell circuit of claim 20, wherein said third and said sixth voltages are each about 5 V.

24. The NVM cell circuit of claim 16, wherein said high throughput mode is used to program a plurality of NVM cells in one-shot.

25. The NVM cell circuit of claim 16, wherein said first positive voltage level is about 4V, and said second positive voltage level is about 1 V.

26. An electrically erasable programmable read-only memory (EEPROM) device, comprising:
    a) a controller configured to control programming, erasing, and reading of a memory portion; and
    b) said memory portion comprising a non-volatile memory (NVM) cell having: (i) a gate over a charge trapping layer, said charge trapping layer being insulated from said gate by a first insulating layer, said charge trapping layer being insulated from a channel by a second insulating layer; and (ii) source and drain on either side of said channel, said channel being under said second insulating layer, wherein said charge trapping layer of said NVM cell is configured to be erased by channel-induced hot holes (CHH) that are produced by ramping down a voltage on said gate from a first positive voltage level to a second positive voltage level, wherein said NVM cell is configured to be programmed through said second insulating layer when in a high throughput mode by Fowler-Nordheim (F-N) tunneling, and when in a field programming mode by channel hot electron (CHE) injection.

27. The EEPROM device of claim 26, wherein said charge trapping layer comprises nitride or oxynitride.

28. The EEPROM device of claim 26, wherein each of said first and second insulating layers comprises oxide.

29. The EEPROM device of claim 26, wherein said first or said second insulating layer comprises a high-k material.

* * * * *